United States Patent
Bauser et al.

[11] Patent Number: 5,503,103
[45] Date of Patent: Apr. 2, 1996

[54] METHOD AND APPARATUS FOR PRODUCING CRYSTALLINE LAYERS

[75] Inventors: Elisabeth Bauser; Mitsubaru Konuma, both of Stuttgart, Germany

[73] Assignee: Max-Planck-Gesellschaft zur Forderung der Wissenshaften e.V., Berlin, Munich, Germany

[21] Appl. No.: 375,796

[22] Filed: Jan. 20, 1995

[30] Foreign Application Priority Data

Jan. 20, 1994 [DE] Germany ................. 4401626

[51] Int. Cl.⁶ .................................. C30B 19/06
[52] U.S. Cl. ................ 117/59; 117/56; 117/934; 437/125; 118/406
[58] Field of Search ................ 117/59, 56, 934; 437/125; 118/406, 416

[56] References Cited

U.S. PATENT DOCUMENTS 3,697,330  10/1972  Minden et al. .................. 117/59
3,713,883  1/1973  Lien ............................... 437/125

FOREIGN PATENT DOCUMENTS 3-23268   1/1991  Japan .............................. 117/59
1423594   2/1976  United Kingdom ............... 117/59

OTHER PUBLICATIONS

Rosztoczy et al, "The Growth of Ge–GaAs and GaP–Si Heterojunctions by Liquid Phase Epitaxy", J. Electrochem. Soc: Solid–State Science and Technology Aug. 1972, pp. 1119–1121.

*Primary Examiner*—Robert Kunemund
*Attorney, Agent, or Firm*—Helfgott & Karas

[57] ABSTRACT

A method for the formation of a layer on at least one substrate. A liquid, which contains the material for forming the layer, flows over the surface of the substrate of the substrate to be coated. A concentration gradient of the layer-forming material is produced in a direction, perpendicular to the direction of the flow of the liquid. As a result, the concentration of the layer-forming material becomes a maximum at one side of the liquid.

11 Claims, 2 Drawing Sheets

METHOD AND APPARATUS FOR PRODUCING CRYSTALLINE LAYERS

BACKGROUND OF THE INVENTION

The invention relates to a method for the formation of a layer and to an apparatus for its implementation. In particular, the invention relates to a method for the preparation of thin monocrystalline and thin polycrystalline layers on monocrystalline, polycrystalline, amorphous or other substrates, the substrate consisting of the same substance as the thin layer (epitaxy) or of a substance different from that of the thin layer.

The preparation of thin crystalline layers from various materials is of great importance for numerous applications. Actual examples of applications from the field of semiconductor technology are thin-layer solar cells. For these and numerous applications, the minority charge carrier lifetime should be long and, moreover, at least so long, that the free-path length of the minority carrier is large in comparison to the thickness of the crystalline layer. For this reason, layers with an overall lower defect density or lower density of charge carrier recombination centers are always superior for such applications to other layers, which have a higher density of recombination centers. Crystalline semiconductor layers, which are produced by liquid phase epitaxy from a solution, have a comparatively low density of defects and, in particular, of charge carrier recombination centers, assuming, of course, that they have been produced under suitable conditions.

Generally, it is necessary to resort to the use of high-grade and correspondingly expensive substrates for producing a layer of high quality, which is largely free of defects. On the other hand, there is increasing interest in the use of extremely inexpensive substrates, the crystallinity, volume properties and surface morphology of which are not perfect, as base materials for the thin layers. For the production of high grade crystalline layers on such base materials, one endeavors to keep the production temperature for the crystalline layers as low as possible. The advantages of a low production temperature are the reduction or avoidance of undesirable interactions with the base material, the resulting high quality of the crystalline layers, which manifests itself by the fact that the layers are largely free of recombination centers and have correspondingly low defect densities, as well as by saving energy. For thermodynamic reasons, the higher the growth temperature, the higher is the density of atomic defects. When growing crystals from solution, one generally works far below the melting temperature of the crystalline material. The high temperatures, which are required, for example, for the melting and subsequently recrystallizing of a material, are avoided.

However, when employing crystalline growth from solution, high supersaturation of the solution is required from time to time. When the whole volume of the solution is highly supersaturated, undesirable, homogeneous, spontaneous nucleation with subsequent parasitic growth of these nuclei can occur. The growth of these unwanted nuclei leads to a desaturation of the solution to the disadvantage of the intended crystallization process.

A further disadvantage of the state of the art lies therein that, in order to keep the solution constantly in a supersaturated state, a temperature difference must be maintained in the growing system.

SUMMARY OF THE INVENTION

It is therefore an object of the present invention to provide a method for the formation of a crystalline layer on a substrate, which can work with improved growing conditions.

In particular, the following advantages are achieved with the invention.

Due to the inventive use of centrifugal forces, the driving forces for crystalline growth can be increased during the deposition from the liquid phase. Centrifugal forces were used for the apparatus for liquid phase epitaxy, described in the German patent application 3 604 260 ("Liquid Epitaxial Method for Producing Three-Dimensional Semiconductor Structures"), in order to conduct the solvent onto the substrate and, after the intended layer thickness is attained, to remove it once again. In the case of the present invention, the centrifugal force is used not to transport and position the liquid solution, but, in particular, to increase the driving force for crystalline growth, that is, to control the local supersaturation of the solution at the growth surface. With this, the controllability of the crystalline growth is improved considerably.

In the case of crystalline substrates, this has a positive effect in that the growth rate can be increased, so that large layer thicknesses can be achieved even at low temperatures. In the case of foreign substrates and noncrystalline substrates, the growth process is facilitated by the high supersaturation and the therefrom resulting increased nucleation probability at the substrate surface and the decreased parasitic nucleation in the bulk of the solution.

The use of centrifugal forces for the inventive method furthermore permits the solution to be kept in a saturated state constantly "in situ". This keeping of the solution in a constant state of supersaturation can furthermore be carried out in an isothermal growing system.

A further advantage lies in the improved growth behavior in the case of substrates of lower quality, such as those, the surface morphology of which is not perfect. The increased concentration, produced over the substrate surface, of the material in the solution for forming the layer, exerts a pressure, with which the material is pressed onto the substrate.

The inventive method promises special advantages for more difficult growth processes, such as the growth of high grade, monocrystalline or polycrystalline semiconductor layers on any base material, such as glass or roof tiles, particularly for producing solar cells. The use of the inventive method also promises improved prospects of success for heteroepitaxy (for example, Si on Ge), where defective lattice matching is to be expected.

The invention is described in greater detail in the following by means of the drawings.

DETAILED DESCRIPTION OF THE PREFERRED EMBODIMENT

Figure 1:
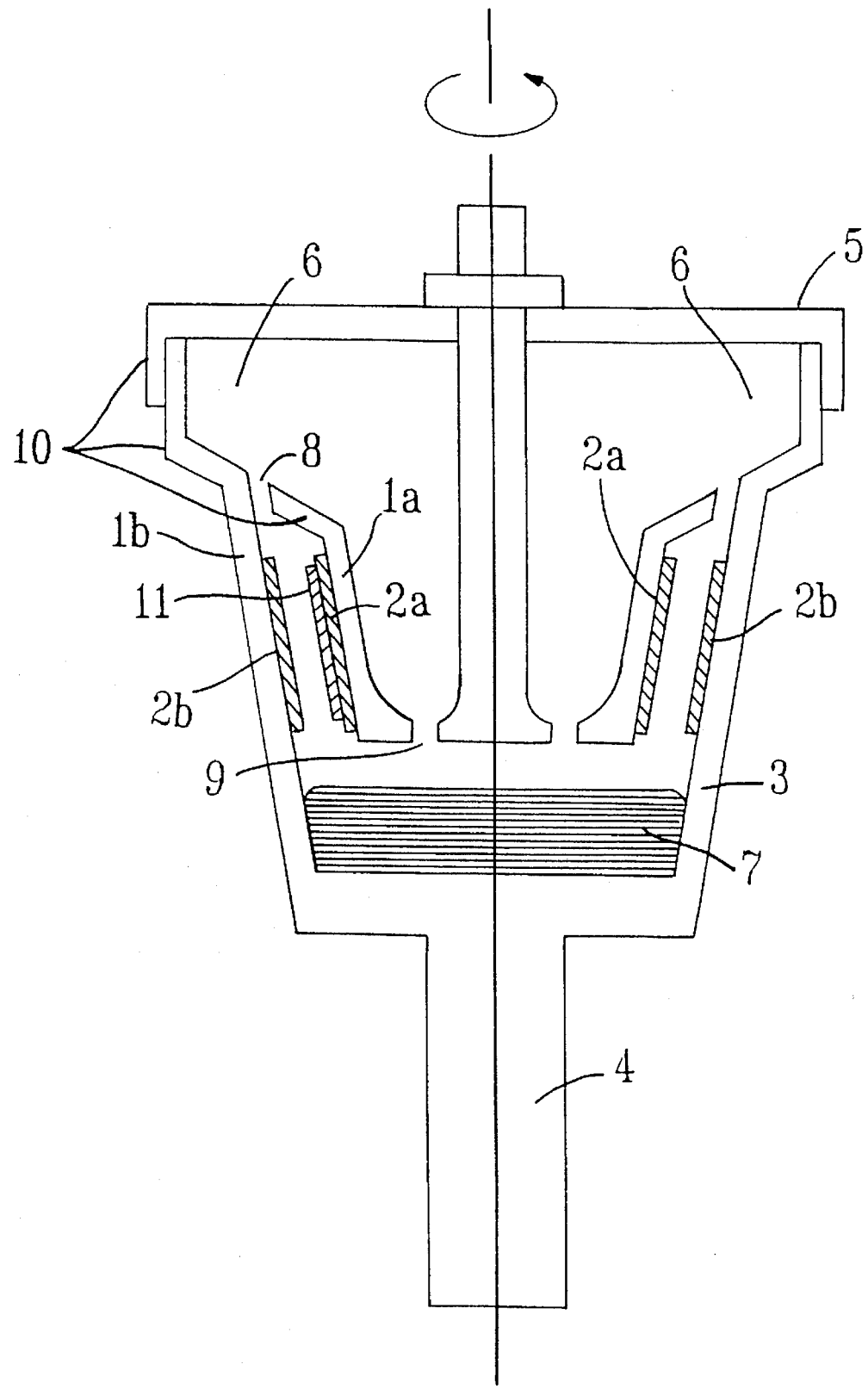
FIG. 1 shows a diagrammatic cross-sectional view of an embodiment for carrying out the inventive method.

The inventive method is now described by way of example and not by way of limitation by means of the embodiment shown in FIG. 1.

To implement the inventive method, an apparatus is required, which is installed in a centrifuge. The apparatus contains a crucible 10 with a cylindrical symmetry, which is shown in cross section in FIG. 1 and is mounted so that it can rotate about its cylindrical axis. For this purpose, the crucible 10 is rigidly connected to a rotor shaft 4 extending in the direction of its axis of symmetry.

The crucible 10 contains a reservoir 3 for keeping the liquid melt solution 7. At the top, the crucible 10 is closed off by a lid 5. The crucible 10 furthermore contains a double-walled truncated cone, at the inner and/or outer surfaces 1a, 1b of which substrate or supply panels 2a, 2b can be fastened. The function of the supply panels is explained further below. At the top, the annular space between the inner and outer cylindrical walls is closed off with the exception of a narrow gap 8. At the bottom, the space between the walls runs into the essentially cylindrically symmetrical reservoir 3, which is formed in one piece with the crucible 10. This reservoir is filled to such a degree, that substrate and solution are brought into contact by the rotation of the crucible 10, which is constructed in one piece with the reservoir 3. In a preferred embodiment, the axis of the crucible 10 is vertical. In a different advantageous embodiment, the cylindrical axis lies at a previously adjusted or also variable angle of between 0° and 90° with the vertical. Instead of a double-walled truncated cone, as in FIG. 1, a double-walled cylinder can also be used as crucible 10. The orientation with respect to the vertical of the substrates mounted on the walls is of decisive importance. When the crucible is rotating, the centrifugal force and gravity namely act on the liquid in the space between the walls. In operation, the resultant of the centrifugal force and gravity should, as far as possible, be perpendicular to the substrate surface. The substrate can therefore be mounted independently of the orientation of the inner and outer cylinder walls in such a manner, that the resultant of the centrifugal force and gravity is perpendicular to it. It is also conceivable to mount the substrates variably with respect to the orientation of their surfaces as a function of the instantaneous rpm.

Depending on whether the substance dissolved in the solvent is lighter or heavier than the solvent or whether the corresponding volume-related atomic or molecular weights of solvent and solute are heavier or lighter, the substrate is mounted on the inner or outer cylinder wall (of course, in the interior of the double-cylinder space). For example, to produce silicon layers from a solution of silicon in gallium, the substrates are mounted on the inner wall, since gallium is heavier than silicon. When the double cylinder is rotated, a concentration increase is developed in the solution "over" the substrate 2a as a result of the action of the centrifugal force (+gravity). Depending on the rpm, this concentration increase leads to a local supersaturation of the solution at the interface with substrate 2a, that is, at the growth surface. The degree of supersaturation can be estimated with sufficient accuracy from the data of the corresponding phase diagram, from the geometric data and from the operating data, such as the rpm of the rotor shaft. A crystalline layer 11 grows on the substrate 2a.

For the example given, centrifugal accelerations of the order of 10g are required (g=acceleration due to gravity). In every case, a centrifugal acceleration must be selected, which is higher than the acceleration considered to be adequate for the methods of the state of the art, in order to transport the solution over the substrate.

Figure 2:
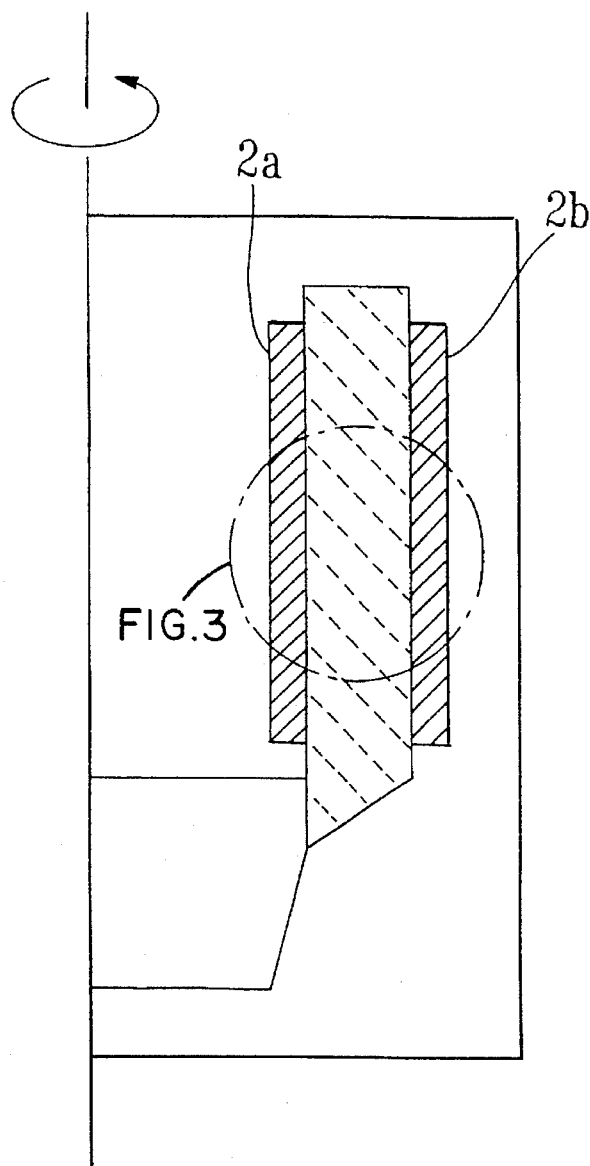
FIG. 2 shows a diagram to explain the formation of a concentration gradient of the material, such as Si in Ga, in the solution for forming the layer.
Figure 3:
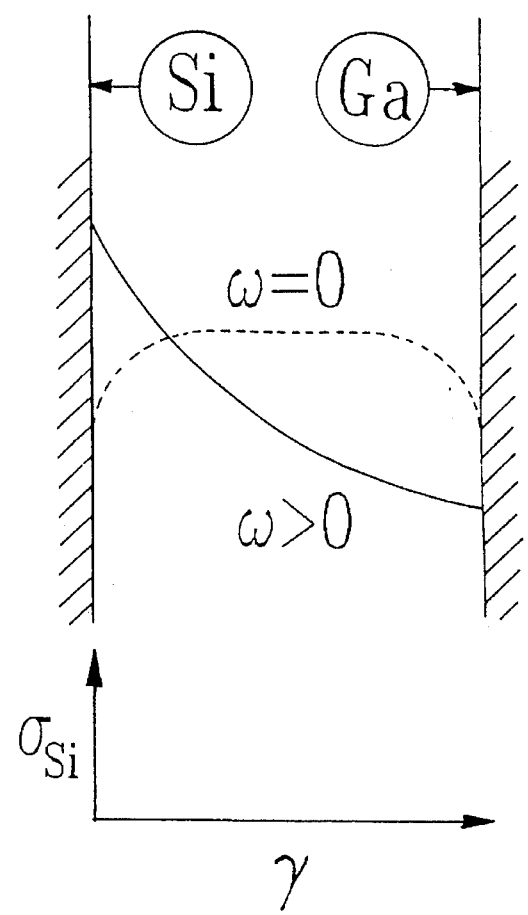

This is shown once again diagrammatically in FIG. 2. The curves, shown in the partial section, reproduce the relative concentration $\sigma_{rel}$ at Si atoms in the Ga solution as a function of the radius of the cylinder axis at $\omega=0$ and $\omega=0$ ($\omega$=angular velocity of the crucible).

At the end of the deposition of the crystalline layer 11, the rpm of the crucible is increased. At the same time, the solution is pulled from the surface of the crystalline layer and flows outwards and upwards through the narrow gap 8 into the interior space 6. When the crucible 10 is decelerated, the solution flows from there through the openings 9 back into the lower part of the reservoir 3.

When high grade crystalline layers are deposited on a foreign substrate, nucleation barriers must be overcome in many cases. These nucleation barriers can be overcome by an increased supersaturation of the solution, which is generated by the action of centrifugal forces over the substrate surface. A corresponding supersaturation, necessary for the nucleation, in the whole of the solution would lead to spontaneous nucleation within the solution, which consequently (since the nuclei continue to grow) would desaturate the solution and prevent the desired deposition on the foreign substrate.

If the surface of the substrate is not smooth, but has, for example, a certain roughness and pores, it is possible in the centrifuge, when the rpm is sufficiently high, to have the dissolved material, which serves for forming the layer, penetrate the fine cavities and rebounding volumes at the surface of the substrate by using pressure, even when the surface tension of the solution is high. The pressure, with which the dissolved substance is pressed onto the substrate, can be regulated by the rpm of the centrifuge and, as already described above, arises out of the preferred deposition of the dissolved material at the substrate surface because of the increased concentration at the surface. This preferred deposition at the substrate surface causes the rebounding volumes and cavities of the surface of the base material to be filled with crystalline material. As a result, as the deposition is continued, a coherent, crystalline layer is formed which, in addition to the adhesive bond formed under suitable conditions, is connected positively with the base material.

If a base material (or substrate) is mounted in the double cylinder, for example, in position 2a and a supply panel of the material to be deposited is mounted in the double cylinder, for example, in position 2b, the specifically lighter molecule in solution in the rotating container is deposited on the substrate, while material is dissolved from the supply panel in position 2b, since the system attempts to maintain the density gradient described (see FIG. 2). As a result of the density gradient of the dissolved material, a continuous transport in the direction from the supply panel, where the material is dissolved, to the substrate or base material, where the dissolved material is deposited as a crystalline layer, is thus obtained. This transport takes place even when the system is completely isothermal. For this method, it is therefore not necessary for the transport of substance to produce or maintain a temperature difference between the base material and the supply panel for depositing the crystalline layer. From the start of the growth up to the planned end, the crystalline layer grows completely isothermally. This means that the growth front of the desired crystalline layer as well as the dissolving surface of the opposite supply substrate can have the same temperature during the whole period of growth. Crystalline material with uniform properties can be obtained in this manner. The growing, particularly of thick, homogeneous layers from solutions of materials, when the phase diagrams are complicated, becomes possible or considerably easier with the isothermal deposition described. In particular, thick, crystalline and homogeneous layers can still be deposited at low temperatures, at which the solubilities generally are low, since the state of saturation of the solution is constantly maintained when a supply of substrate is present. The thickness of the crystalline layer is thus not limited by the amount of material in solution at a particular time.

The described maintaining of the state of saturation by the transport of material from the supply panel in the direction of the substrate can, however, be reinforced additionally by the fact that a temperature difference is set up additionally between the supply panel 2b and the substrate 2a.

To begin with, a molding with a microscopically smooth surface is used for the deposition for the production of polycrystalline layers on a metallic "substrate" as base material. The smooth surface can also be profiled in a suitable manner, for example, when used for solar cells for the so-called "light capture" (improved utilization of the light striking and reflected from the solar cell). However, the crystallizing material should not adhere to the surface of the molding. Materials for such moldings can, for example, be certain types of graphite. After the crystalline layer is deposited, as described above, on a molding of this type, a portion, that is, a thin film of the metallic solvent used is allowed to solidify on the surface of the crystalline layer that has been grown. The thickness of the metallic film solidifying on the crystalline layer can be selected and is adjusted so that the resulting double layer of metal and crystalline material is self-supporting. If the double layer obtained is now lifted from the non-adhering molding, one has the desired crystalline film on a metallic base material or "substrate".

If the deposited crystalline layer consists, for example, of a semiconductor material, the structure, so obtained, offers the high grade and planar metal-to-semiconductor contact required for many applications, particularly for solar cells.

As shown in earlier work, crystalline layers can also be deposited in the form of epitaxial "doped multilayers" or of compositionally different "heteroepitaxial multilayers", when a centrifuge is used. The multilayers are deposited in automated equipment in a single epitaxial process run. If suitable parameters are selected for the materials and the process, the structure elements, required, for example, for solar cells, that is, the part of the cell essential for the function, are obtained in a single epitaxial process run.

As already mentioned, the fact that it is not necessary to use crystalline substrate material, which has been grown from the melt, is one of the advantages of the method. Furthermore, temperatures, which are significantly lower than the melting temperature of the deposited crystalline materials, can be used throughout for the production of the crystalline layers. In addition, it must also be emphasized that the apparatus described makes the diffusion method customary in the art, which naturally must be carried out at very high temperatures and is used for the production of layered structures such as p-n transitions, completely superfluous. Instead, crystalline multilayers, such as p-n layers are produced at low temperatures in a single epitaxial process run in automated equipment and according to the method described above.

We claim:

1. A method for the formation of a layer on at least one substrate comprising the steps of bringing a liquid which contains a material for forming the layer to flow over a surface of the substrate by exerting a centrifugal force on the liquid which contains the material for forming the layer and flows over the surface of the substrate to be coated, and producing a concentration gradient of the layer-forming material in a direction, perpendicular to a direction of flow of the liquid, in such a manner, that the concentration of the layer-forming material becomes a maximum at one side of the liquid, wherein a flow of said liquid is subjected to a centrifugal acceleration which is higher than acceleration required to transport the liquid over the substrate.

2. The method of claim 1, and comprising the step of mounting the substrate to be coated on the side of the liquid, on which the concentration of the layer-forming material becomes a maximum.

3. The method of claim 1, wherein the substrate to be coated is oriented to a vertical such that the resultant of the centrifugal force and gravity obtains a component perpendicular to the surface of the substrate.

4. The method of claim 3, wherein the resultant of the centrifugal force and gravity is perpendicular to the surface of the substrate.

5. The method of claim 1, comprising the step of disposing the substrate at a distance from one wall of a reservoir in which said liquid flows over the surface of the substrate and the liquid, under operating conditions, is in contact with the substrate and the wall.

6. The method of claim 5, wherein the wall is formed by a supply panel, and the supply panel contains the material for forming the layer.

7. The method of claim 6, wherein a temperature difference is established between the supply panel and the substrate.

8. An apparatus for implementing the method of claim 1, comprising a cylindrically symmetrical crucible mounted so that it can rotate about a cylindrical axis thereof and having a reservoir for accommodating a solution of the liquid, said reservoir having an outer cylindrically symmetrical surface and an inner cylindrically symmetrical surface which are at such a distance from one another, that a space, through which the liquid flows, is formed therebetween, and wherein said at least one substrate is mounted at an inner wall of one of the symmetrical surfaces therebetween.

9. The apparatus of claim 8, wherein one or several supply panels are mounted at the inner walls of the surfaces facing the space therebetween.

10. The apparatus of claim 8, wherein a plurality of substrates are mounted in such a manner, that surfaces thereof lie in a vertical plane or, together with a vertical plane, enclose an angle.

11. The apparatus of claim 8, and further comprising a lower inlet end facing the reservoir and provided in said space, and an upper outlet end.

* * * * *